(12) United States Patent  (10) Patent No.: US 8,697,565 B2
Huang et al.  (45) Date of Patent: Apr. 15, 2014

(54) SHALLOW VIA FORMATION BY OXIDATION

(75) Inventors: Lin-Ya Huang, Hsin-Chu (TW); Chi-Sheng Juan, Zhubei (TW); Chien-Lin Tseng, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 19 days.

(21) Appl. No.: 13/435,918

(22) Filed: Mar. 30, 2012

(65) Prior Publication Data

US 2013/0256890 A1  Oct. 3, 2013

(51) Int. Cl.
*H01L 21/44* (2006.01)

(52) U.S. Cl.
USPC ........... 438/612; 438/443; 438/622; 438/631; 438/635; 438/648; 438/650; 438/687; 257/762; 257/781

(58) Field of Classification Search
USPC ............. 257/750, 752, 753, 762, E23.019, 257/E23.02, E23.26; 438/1, 115, 443, 612, 438/626, 628, 633, 644, 645, 648, 654, 656, 438/687, 692, 705, 722
See application file for complete search history.

(56) References Cited

U.S. PATENT DOCUMENTS

| | | | | |
|---|---|---|---|---|
| 6,096,497 A | * | 8/2000 | Bauer | 435/4 |
| 6,261,953 B1 | * | 7/2001 | Uozumi | 438/687 |
| 6,379,782 B2 | * | 4/2002 | Iguchi et al. | 428/209 |
| 6,475,909 B2 | * | 11/2002 | Uozumi | 438/678 |
| 6,649,993 B2 | * | 11/2003 | Theil | 257/458 |
| 6,818,556 B2 | * | 11/2004 | Uozumi | 438/687 |
| 6,995,089 B2 | * | 2/2006 | Chou et al. | 438/691 |
| 7,741,214 B2 | * | 6/2010 | Takewaki et al. | 438/627 |
| 2001/0034125 A1 | * | 10/2001 | Uozumi | 438/678 |
| 2001/0036737 A1 | * | 11/2001 | Iguchi et al. | 438/692 |
| 2002/0111004 A1 | * | 8/2002 | Suzuki et al. | 438/601 |
| 2003/0001271 A1 | * | 1/2003 | Uozumi | 257/758 |
| 2010/0052175 A1 | * | 3/2010 | Seidel et al. | 257/762 |
| 2011/0027128 A1 | * | 2/2011 | Gridelet et al. | 422/82.01 |
| 2011/0300778 A1 | * | 12/2011 | Ono et al. | 451/36 |
| 2012/0143568 A1 | * | 6/2012 | Kagan et al. | 702/189 |
| 2012/0299126 A1 | * | 11/2012 | Daamen et al. | 257/414 |
| 2013/0043589 A1 | * | 2/2013 | Kim et al. | 257/741 |

\* cited by examiner

*Primary Examiner* — Fernando L Toledo
*Assistant Examiner* — Christine C Lau
(74) *Attorney, Agent, or Firm* — Slater & Matsil, L.L.P.

(57) ABSTRACT

A method, and an apparatus formed thereby, to construct shallow recessed wells on top of exposed conductive vias on the surface of a semiconductor. The shallow recessed wells are subsequently filled with a conductive cap layer, such as a tantalum nitride (TaN) layer, to prevent or reduce oxidation which may otherwise occur naturally when exposed to air, or possibly occur during an under-bump metallization process.

20 Claims, 6 Drawing Sheets

SHALLOW VIA FORMATION BY OXIDATION

BACKGROUND

Generally, integrated circuits (ICs) comprise electronic components, such as transistors, capacitors, or the like, formed on a substrate. One or more metal layers are then formed over the electronic components to provide electrical connections between the electronic components and to provide electrical connections to external devices.

The trend in the semiconductor industry is towards the miniaturization or scaling of integrated circuits, in order to provide smaller ICs and improve performance, such as increased speed and decreased power consumption. While aluminum and aluminum alloys were most frequently used in the past for the material of conductive lines in integrated circuits, the current trend towards IC miniaturization necessitates the use of copper for a conductive material because copper has lower activation energy than aluminum, allows higher current densities than aluminum, better electrical characteristics than aluminum, and has higher thermal conductivity than aluminum, as well as decreased resistance and a higher melting point.

The change from aluminum to copper conductive lines has introduced new challenges in the manufacturing process. For example, copper surfaces oxidize easily when exposed to oxygen. This may present bonding issues for copper surfaces which are exposed to air.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION

The making and using of the embodiments of the present disclosure are discussed in detail below. It should be appreciated, however, that the embodiments provide many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to embodiments in a specific context, namely forming shallow via well formations in exposed copper interconnect surfaces using a Cu oxidation process. The disclosure may also be applied, however, to other designs in which it is desirable to limit contamination on exposed Cu surfaces, or to increase bonding qualities between semiconductor Cu surface layers and external devices.

FIGS. 1-12 illustrate various cross-section views of an embodiment in which a device, such as a biosensor semiconductor device, having exposed copper (Cu) interconnects, may be exposed to an oxidation process. As explained in greater detail below, the oxidation process results in a copper oxide being formed on the exposed copper surfaces. The copper oxide is then removed, thereby creating shallow via wells on the exposed copper surfaces. The shallow via wells on the copper surfaces may then be filled with a conductive cap layer, such as a tantalum nitride (TaN), thereby sealing and preventing surface oxidation from occurring prior to attaching external wires or devices.

Figure 1:
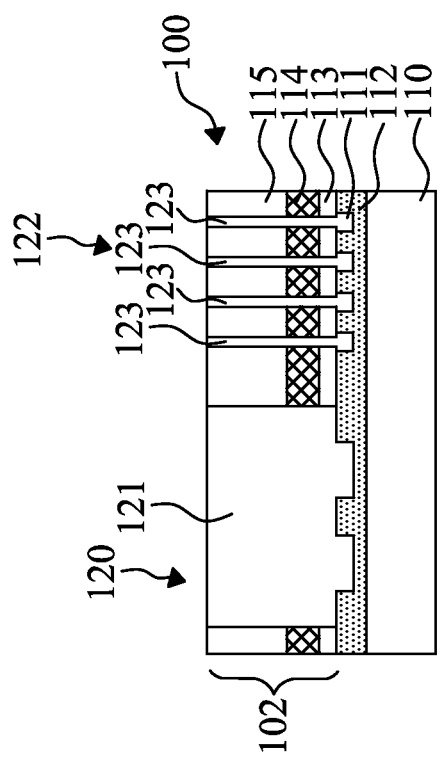

Referring first to FIG. 1, a device 100, such as a biosensor semiconductor device, having a substrate 110 is provided. The substrate 110 may comprise electrical devices such as various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application. The substrate 110 may further include one or more dielectric layers and or metallization layers, providing electrical connections between various electrical devices and forming electrical circuits.

As illustrated in FIG. 1, the device 100 may include one or more metallization layers. Generally, metallization layers comprise layers of conductive material separated by one or more dielectric layers and are used to route electrical signals between electrical devices or layers and to provide external electrical connectivity. For example, FIG. 1 illustrates an uppermost inter-metal dielectric (IMD) layer 112 having interconnects 111 formed therein. The dielectric layers, such as the IMD layer 112, may be formed of a dielectric or low-K dielectric material, such as fluorosilicate glass (FSG) formed by plasma-enhanced (PECVD) techniques or high-density plasma CVD (HDPCVD), or the like, and may include intermediate etch stop layers. Other materials may include, for example, SiC, TEOS, hard black diamond (HBD), or the like. The interconnects 111 may be formed in the uppermost IMD layer 112 by using photolithography techniques to deposit and pattern a photoresist material on the IMD layer 112 to expose portions of the IMD layer 112 that are to become the interconnects 111. An etch process, such as an anisotropic dry etch process, may be used to create openings in the IMD layer 112. The openings are then filled with a conductive material, such as copper. A planarization process, such as a chemical mechanical polishing (CMP) process, may be used to planarize and/or remove excess material.

Also illustrated in FIG. 1 is a passivation layer 102 overlying the uppermost IMD layer 112. The passivation layer 102 may be a single layer or a multi-layer structure. For example, FIG. 1 illustrates an embodiment in which a multi-layer structure comprising a first passivation layer 113, a second passivation layer 114, and a third passivation layer 115. The first passivation layer 113 may comprise a dielectric material such as a SiN, plasma-enhance oxide (PEOX), a plasma-enhanced SiN (PE-SiN), undoped silicate glass (USG), plasma-enhanced USG (PE-USG), or the like, and patterned over the surface of the uppermost IMD layer 112. In an embodiment the thickness of the first passivation layer 113 may range from about 720 Å to about 780 Å, such as about 750 Å thick. The first passivation layer 113 may act as an etch stop layer while performing an etching process when forming interconnects and/or contacts. The etch stop layers are formed of a dielectric material having a different etch selectivity from adjacent layers, e.g., the underlying IMD layer 112, and the overlying layers, e.g., the second and third passivation layers 114, 115.

The second and third passivation layers 114, 115 are formed and patterned over the first passivation layer 113 as illustrated in FIG. 1. The second and third passivation layers 114,115 may be formed of a dielectric material, such as SiN, USG, PE-USG, PE-SiN, combinations thereof, and/or the like, by any suitable method, such as CVD, physical vapor deposition (PVD), or the like. In an embodiment, the second passivation layer 114 may comprise USG and have a thickness which ranges from about 1460 Å to about 1,540 Å, such as about 1,500 Å thick. The third passivation layer 115 may comprise SiN and may be have a range of thickness from 2,900 Å to about 3,100 Å, such as about 3,000 Å thick.

The passivation layers described above, along with the materials and thicknesses are provided for illustrative purposes only. One of ordinary skill in the art will appreciate that the number of passivation layers are shown for illustrative purposes only. As such, other embodiments may include any number of passivation layers.

External contact pads 121 and sensor contact pads 123 shown in FIG. 1 provide an electrical connection between an external device and interconnects 111 formed in the IMD layer 112. As described in greater detail below, under-bump metallization (UBM) structures may be formed on the external contact pad 121. The external contact pad 121 and sensor contact pads 123 are patterned in the passivation layer 102 using photolithography (or similar) techniques, and may be formed of any suitable conductive materials, such as copper, tungsten, aluminum or silver, or the like. It should be noted that only one external contact pads 121 and four sensor contact pads 123 are shown for illustrative purposes. In other embodiments, more or fewer pads may be used.

Figure 2:
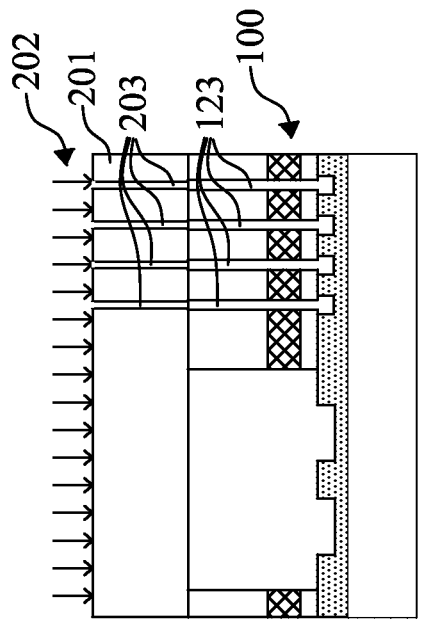
FIGS. 1-12 illustrate various intermediate stages of fabrication of a semiconductor device in accordance with an embodiment.

FIG. 2 illustrates an embodiment wherein one or more of the sensor contact pads 123 surfaces may be oxidated using, for example, an oxidation process (indicated in FIG. 2 by arrows 202) such as an $O_2$ plasma process, or exposure to an oxygen-containing environment. In an embodiment, the mask layer 201 may comprise a photoresist mask, a hard mask, combinations thereof, or the like, having a thickness ranging from about 4,250 Å to 4,350 Å, such as about 4,300 Å and may be patterned using photolithography and etching techniques.

Figure 3:
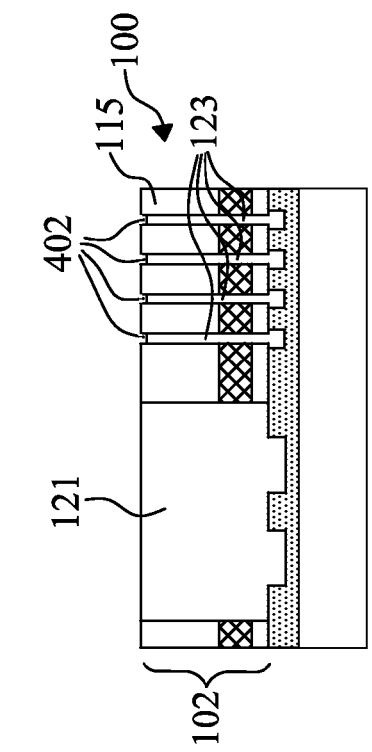

An oxidation process, such as an $O_2$ plasma process, may then be applied to expose the surfaces of the sensor contact pads 123 to oxygen, thereby causing an oxidation layer to be formed (see FIG. 3). In an embodiment in which an $O_2$ plasma process is utilized for the oxidation process, an $O_2$ flow rate of about 7000 sccm at a pressure of about 760 mTorr to about 800 mTorr and at power of about 750 Watts and at a temperature of less than about 300° C., for example, may be used for a period of about 60 seconds. The external contact pad 121 is protected by the mask layer 201, preventing oxidation. Following the oxidation process, the mask layer 201 may be removed using a suitable photoresist stripper process.

FIG. 3 illustrates the device 100 following the removal of the mask layer 201 in accordance with an embodiment. The mask layer 201 may be removed by any suitable method. In an embodiment in which the mask layer 201 comprises a photoresist mask, the mask layer 201 may be removed using a suitable photoresist stripper or ashing process. In this embodiment, the photoresist mask may be removed with no or little residues. Following the removal of the photoresist, an oxide layer, e.g., copper oxide layer, remains on a top surface of the sensor contact pad 123 due to oxidation induced by the $O_2$ plasma process. Likewise, a thin oxide layer may develop on a top surface of the external contact pad 121 due to the exposure to oxygen in the air and/or the photoresist stripping process. In accordance with an embodiment, the Cu oxide accumulation may range from about 80 Å to about 120 Å, such as about 100 Å thick on a top surface of the sensor contact pad 123, and about 10 Å or less in thickness on a top surface of the external contact pad 121.

Figure 4:
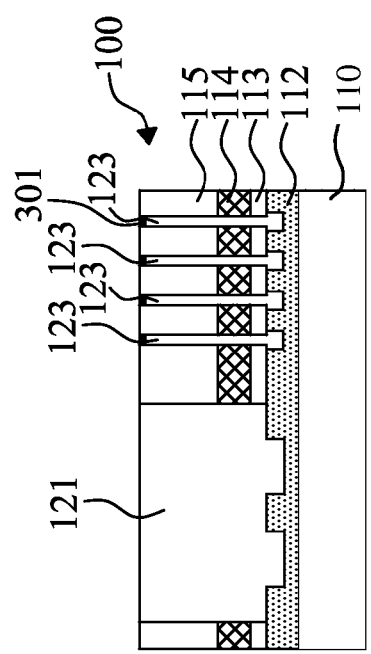

FIG. 4 illustrates a cross sectional view of the device 100 following an oxide removal process, thereby forming shallow via wells 402. In an embodiment, Cu oxide may be removed from the external contact pad 121 and the sensor contact pads 123 using a CMP process with a suitable chemical cleaner such as CX-100 (citric acid). For example, in an embodiment the cleaning process may be performed about 50 seconds, to properly remove excess Cu oxide deposits from the external contact pad 121 and the sensor contact pads 123.

Each of the shallow via wells 402 may be recessed below the surrounding passivation layer 102. In an embodiment, the shallow via wells 402 may have a depth in the range of about 80 Å to about 120 Å, such as about 100 Å, although other depths may be used.

Figure 5:
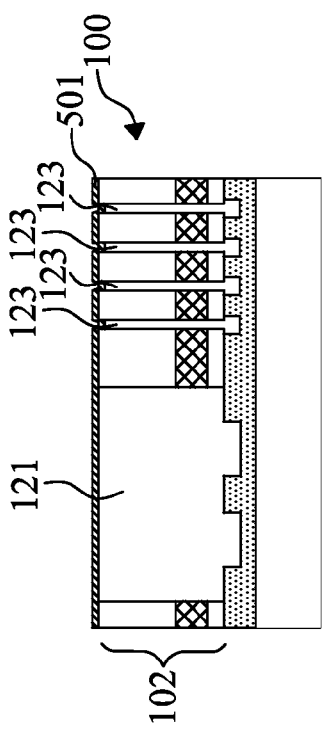

FIG. 5 illustrates a cross sectional view of the device 100 in which a conductive layer 501, such as a layer of tantalum nitride (TaN), has been deposited over a surface of the passivation layer 102 and the external contact pad 121 and the sensor contact pads 123. The conductive layer 501 may be formed by a blanket deposition (or similar) process to fill the shallow via wells 402. In an embodiment, the TaN layer may range in thickness from about 285 Å to about 315 Å, such as about 300 Å thick.

Figure 6:
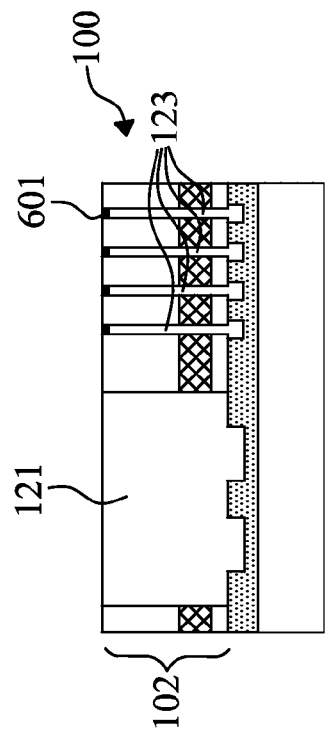

FIG. 6 illustrates the cross sectional view of the device 100 after a CMP process has been utilized to remove excess material of the conductive layer 501 (see FIG. 5), thereby forming a conductive cap layer 601 within the shallow via wells 402. In an embodiment, the conductive cap layer 601 may have a thickness of about 80 521 to about 120 Å, e.g., about 100 Å, on top of each of the shallow via wells of the sensor contact pads 123. In this embodiment, the conductive cap layer 601 is removed from over the external contact pad 121.

Figure 7:
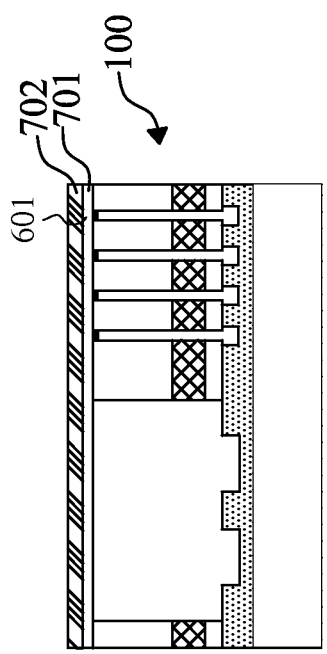

FIG. 7 illustrates a cross sectional view of the device 100 having a first UBM conductive layer 701, which may be layered via blanket film deposition (or similar). As explained in greater detail below, FIGS. 7-12 illustrate a process of forming an external contact, namely a UBM structure with a pillar and solder bump. Other embodiments, however, may utilize different contacts. The structure provided herein is provided for illustrative purposes only.

In accordance with an embodiment, the first UBM conductive layer 701 is a seed layer. The seed layer is a thin layer of a conductive material that aids in the formation of a thicker layer during subsequent processing steps. In an embodiment, the first UBM conductive layer 701 may be formed by depositing a thin conductive layer, such as a thin layer of Cu, Ti, Ta, TiN, TaN, combinations thereof, or the like, using CVD or PVD techniques.

FIG. 7 also illustrates the formation of a second UBM conductive layer 702 which will subsequently be used to construct a conductive layer in accordance with an embodiment. The second UBM conductive layer 702 may be formed of any suitable conductive material, including Cu, Ni, Pt, Al, combinations thereof, or the like, and may be formed through any number of suitable techniques, including PVD, CVD, electrochemical deposition (ECD), molecular beam epitaxy (MBE), atomic layer deposition (ALD), electroplating, and the like.

Figure 8:
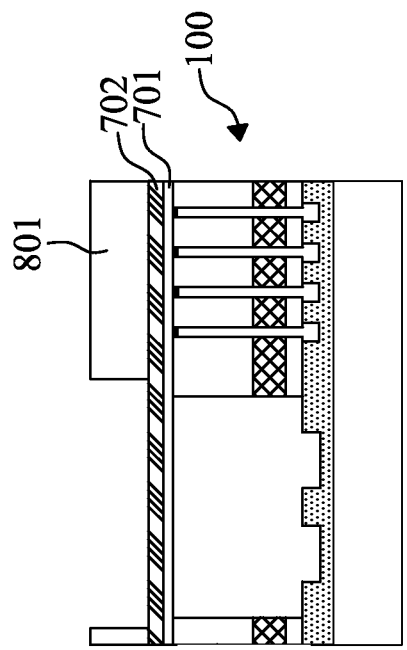

FIG. 8 illustrates the application of a patterned mask 801, such as a dry film resist, used for defining the lateral boundaries of a third UBM conductive layer to be subsequently formed as discussed in further detail below. The patterned mask 801 may be a patterned photoresist mask, hard mask, a combination thereof, or the like. The patterned mask 801 may be patterned using photolithography and etching techniques, which involve depositing a photoresist material, masking, exposing, and developing to create an opening in the photoresist material which exposes portions of the underlying second UBM conductive layer 702.

Figure 9:
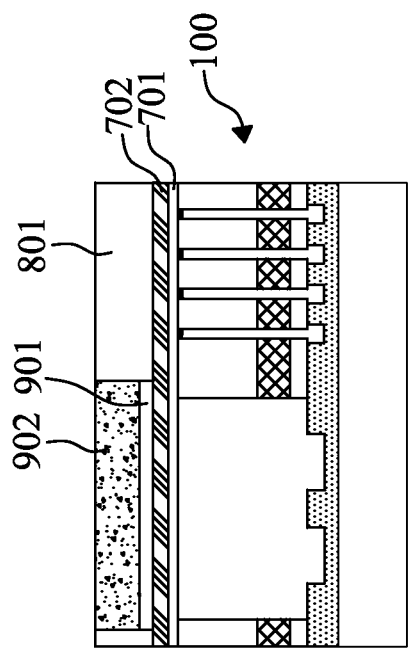

FIG. 9 illustrates the formation of the third UBM conductive layer 901 formed over the second UBM conductive layer 702 in accordance with an embodiment. As described in greater detail below, solder material will be formed over the second UBM conductive layer 702. During the soldering process, an inter-metallic compound (IMC) layer (not shown) may be naturally formed at the joint between the solder material and the underlying surface. It has been found that some materials may create a stronger, more durable IMC layer than others. As such, it may be desirable to form a cap layer, such as the third UBM conductive layer 901, to provide an IMC layer having more desirable characteristics. For example, in an embodiment in which the second UBM conductive layer 702 is formed of copper, a third UBM conductive layer 901 formed of nickel may be desirable. Other materials, such as Pt, Au, Ag, combinations thereof, or the like, may also be used. The third UBM conductive layer 901 may be formed through any number of suitable techniques, including PVD, CVD, ECD, MBE, ALD, electroplating, and the like.

Furthermore, FIG. 9 also illustrates formation of a connection layer 902, such as a solder material. In an embodiment, the connection layer 902 comprises SnPb, a high-Pb material, a Sn-based solder, a lead-free solder, or other suitable conductive material.

Figure 10:
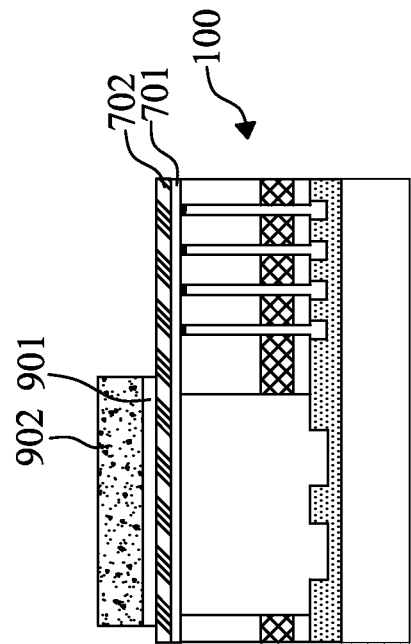

Thereafter, as illustrated in FIG. 10, the patterned mask 801 may be removed. In embodiments in which the patterned mask 801 is formed from photoresist materials, the photoresist may be stripped by, for example, a chemical solution such as a mixture of ethyl lactate, anisole, methyl butyl acetate, amyl acetate, cresol novolak resin, and diazo photoactive compound (referred to as SPR9), or another stripping process.

Figure 11:
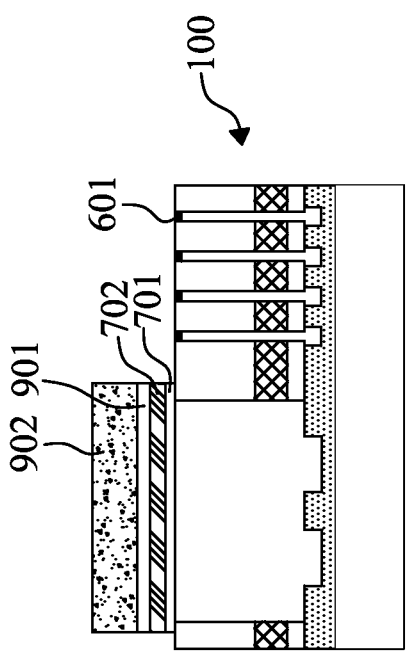

FIG. 11 illustrates the semiconductor device 100 wherein the first UBM conductive layer 701 and second UBM conductive layer 702 have been patterned using an isotropic (or similar) UBM etch process, followed by cleaning process, such as a wet dip in a chemical solution of phosphoric acid ($H_3PO_4$) and hydrogen peroxide ($H_2O_2$), referred to as DPP, with 2% hydrofluoric (HF) acid, or another cleaning process.

It has been found that the processes used to pattern the first UBM conductive layer 701 and the second UBM conductive layer 702 may form an oxidation layer over the sensor contact pads 123, particularly when a material such as copper is used to form the sensor contact pads 123. As discussed above, shallow via wells 402 were formed in the sensor contact pads 123 and conductive cap layers 601 were formed thereover to protect the material of the sensor contact pads 123, thereby preventing or reducing oxidation of the sensor contact pads 123. Because in some embodiments such as that shown in FIG. 11 the external contact pad 121 is protected during the patterning of the first UBM conductive layer 701 and the second UBM conductive layer 702, oxidation may not be an issue for the external contact pad 121.

Figure 12:
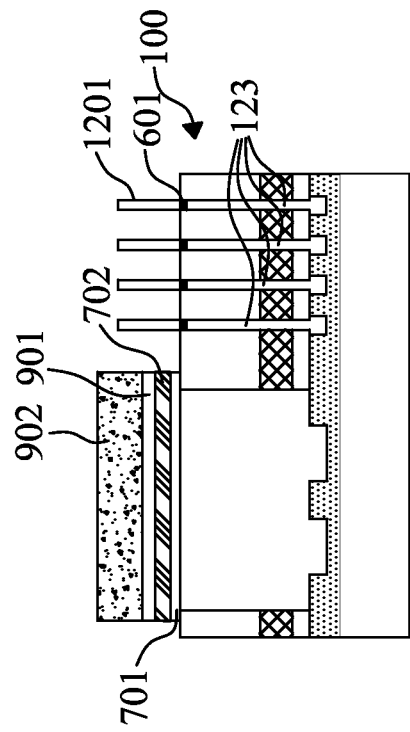

FIG. 12 illustrates a cross sectional view of device 100 wherein an external sensor 1201, such as a biological sensor, is electrically coupled to the sensor contact pads 123. In an embodiment, the external sensor 1201 may comprise a self-assembled monolayer (SAM) patterned onto the conductive cap layers 601. The SAM monolayer may be patterned on top of the surface layer of the sensor contact pads 123 by any suitable patterning method such as locally attract, locally remove or modification of tail group strategies. In an embodiment, the patterned SAMs may provide functional external sensors, such as a biosensor, to the semiconductor device 100.

Thereafter, a solder reflow process and other back-end-of-line (BEOL) processing techniques suitable for the particular application may be performed. For example, an encapsulant may be formed, a singulation process may be performed to singulate individual dies, wafer-level or die-level stacking, and the like, may be performed. Furthermore, the external contact pads 121 may be electrically coupled to another substrate, such as a printed circuit board (PCB), interposer, packaging substrate, another die/wafer, or the like. The external sensor 1201 may be positioned, for example, to detect electrical signals when sampling biological conditions, such as detecting enzymes, proteins, DNA, and the like to perform various tests Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. A method for forming a semiconductor device, the method comprising:
providing a substrate having one or more metallization layers and one or more passivation layers over an uppermost metallization layer, one or more external contact pads and one or more sensor contact pads extending through the one or more passivation layers;
recessing the one or more sensor contact pads below an upper surface of the one or more passivation layers, thereby forming recesses, the recessing not recessing the one or more external contact pads;
forming a conductive cap layer within the recesses; and
forming an external contact over the one or more external contact pads.

2. The method of claim 1, wherein the conductive cap layer comprises a tantalum nitride layer.

3. The method of claim 1, wherein the recessing is performed at least in part by oxidizing a portion of the one or more sensor contacts.

4. The method of claim 3, wherein the oxidizing is performed at least in part by using an oxygen plasma process.

5. The method of claim 3, further comprising removing oxidized portions of the one or more sensor contact pads using a chemical mechanical polishing process.

6. The method of claim 1, wherein an upper surface of the conductive cap layer is planar with an upper surface of the one or more passivation layers.

7. The method of claim 1, wherein the conductive cap layer has a thickness from 80 Å to 100 Å.

8. The method of claim 1, further comprising forming a mask layer over the one or more external contact pads and one or more sensor contact pads, patterning the mask layer to expose the one or more sensor contact pads, the patterned mask layer protecting the one or more external contact pads during an oxidation process.

9. The method of claim 1, further comprising forming a self-assembled monolayer (SAM) electrically coupled to the sensor contacts.

10. A method for forming a semiconductor device, the method comprising:
providing a substrate having electrical circuitry formed thereon, one or more metallization layers, and one or more passivation layers over an uppermost metallization layer, one or more external contact pads and one or more sensor contact pads extending through the one or more passivation layers;
forming a mask layer over the one or more external contact pads and the one or more sensor contact pads;
patterning the mask layer to expose the one or more sensor contact pads, leaving the one or more external contact pads protected;
oxidizing an upper surface of the one or more sensor contact pads; and
replacing oxidized portions of the one or more sensor contact pads with a conductive cap layer.

11. The method of claim 10, wherein the oxidizing is performed at least in part by using an oxygen plasma process.

12. The method of claim 10, wherein the replacing is performed at least in part by using a chemical mechanical polishing process.

13. The method of claim 10, wherein the conductive cap layer has a thickness from 80 Å to 120 Å.

14. The method of claim 10, further comprising forming a self-assembled monolayer (SAM) electrically coupled to the sensor contacts.

15. The method of claim 10, wherein the conductive cap layer comprises tantalum nitride.

16. An apparatus comprising:
a substrate having one or more metallization layers and one or more dielectric layers over an uppermost metallization layer;
one or more external contact pads and one or more sensor contact pads extending through the one or more dielectric layers, the one or more sensor contact pads being recessed below an upper surface of an uppermost dielectric layer of the one or more dielectric layers, an upper surface of the one or more sensor contact pads being lower than an upper surface of the one or more external contact pads, the one or more external contact pads configured to electrically connect to a device on a different substrate;
a conductive cap layer over each of the one or more sensor contact pads, an upper surface of the conductive cap layers being coplanar with the upper surface of the uppermost dielectric layer; and
external contacts directly overlying respective ones of the one or more external contact pads.

17. The apparatus of claim 16, wherein the conductive cap layer comprises a tantalum nitride layer.

18. The apparatus of claim 16, wherein the one or more external contact pads and the one or more sensor contact pads comprise copper.

19. The apparatus of claim 16, further comprising a self-assembled monolayer (SAM) electrically coupled to the sensor contact pads.

20. The apparatus of claim 16, wherein the conductive cap layer has a thickness from 80 Å to about 120 Å.

* * * * *